(12) United States Patent
Shih et al.

(10) Patent No.: US 11,830,959 B2
(45) Date of Patent: Nov. 28, 2023

(54) PHOTODETECTION DEVICE AND MANUFACTURING METHOD THEREOF

(71) Applicant: Taiwan Semiconductor Manufacturing Company, Ltd., Hsinchu (TW)

(72) Inventors: Chih-Tsung Shih, Hsinchu (TW); Felix yingkit Tsui, Cupertino, CA (US); Stefan Rusu, Sunnyvale, CA (US); Chewn-Pu Jou, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 259 days.

(21) Appl. No.: 17/161,700

(22) Filed: Jan. 29, 2021

(65) Prior Publication Data
US 2022/0246784 A1 Aug. 4, 2022

(51) Int. Cl.
*H01L 31/107* (2006.01)

(52) U.S. Cl.
CPC ................. *H01L 31/1075* (2013.01)

(58) Field of Classification Search
CPC .................................................. H01L 31/1075
See application file for complete search history.

(56) References Cited

U.S. PATENT DOCUMENTS

| | | | | |
|---|---|---|---|---|
| 7,397,101 B1* | 7/2008 | Masini | ................ | G02B 6/4295 257/656 |
| 11,393,939 B2* | 7/2022 | Chern | ................... | H01L 31/105 |
| 11,393,940 B2* | 7/2022 | Chern | ................. | H01L 31/1804 |
| 11,404,590 B2* | 8/2022 | Chern | ................... | H01L 31/105 |
| 2013/0193546 A1* | 8/2013 | Webster | ............ | H01L 31/02363 257/438 |
| 2013/0202005 A1* | 8/2013 | Dutt | ....................... | H01S 5/3201 372/50.1 |
| 2014/0284450 A1* | 9/2014 | Chen | ................. | H01L 31/02327 257/432 |
| 2014/0291682 A1* | 10/2014 | Huang | ................ | H01L 31/1075 257/55 |
| 2015/0076641 A1* | 3/2015 | Huang | .................. | H01L 31/107 257/438 |
| 2015/0097256 A1* | 4/2015 | Ang | ................... | H01L 31/02327 438/69 |

(Continued)

*Primary Examiner* — Bitew A Dinke
(74) *Attorney, Agent, or Firm* — JCIPRNET

(57) ABSTRACT

A photodetection device and a manufacturing method are provided. The photodetection device includes an absorption structure, a cathode, a charge multiplication region and an anode. The absorption structure is formed in a recess at a surface region of a semiconductor substrate, and configured to receive an incident light. The cathode is formed on a top surface of the absorption structure, and has a first conductive type. The charge multiplication layer is in lateral contact with the absorption structure, and is an intrinsic portion of the semiconductor substrate extending into the semiconductor substrate from a topmost surface of the semiconductor substrate. The anode is in lateral contact with the charge multiplication layer from a side of the charge multiplication region away from the absorption structure, and is a doped region in the semiconductor substrate having a second conductive type complementary to the first conductive type.

20 Claims, 14 Drawing Sheets

(56) References Cited

U.S. PATENT DOCUMENTS

| | | | |
|---|---|---|---|
| 2016/0155863 A1* | 6/2016 | Baehr-Jones | H01L 27/14649 |
| | | | 438/69 |
| 2016/0218236 A1* | 7/2016 | Dhulla | H01L 27/1443 |
| 2018/0033783 A1* | 2/2018 | Schneider | H01L 27/0259 |
| 2019/0229227 A1* | 7/2019 | Samani | H01L 31/105 |
| 2020/0020734 A1* | 1/2020 | Wang | H01L 27/14636 |
| 2020/0098803 A1* | 3/2020 | Lo | H01L 27/14612 |
| 2020/0319345 A1* | 10/2020 | Cheng | H01L 27/14812 |
| 2020/0395393 A1* | 12/2020 | Cheng | G01S 7/4914 |
| 2021/0066529 A1* | 3/2021 | Lu | H01L 27/1461 |
| 2021/0119069 A1* | 4/2021 | Van Sieleghem | H01L 27/1446 |
| 2022/0107461 A1* | 4/2022 | Dosunmu | G02B 6/12004 |

\* cited by examiner

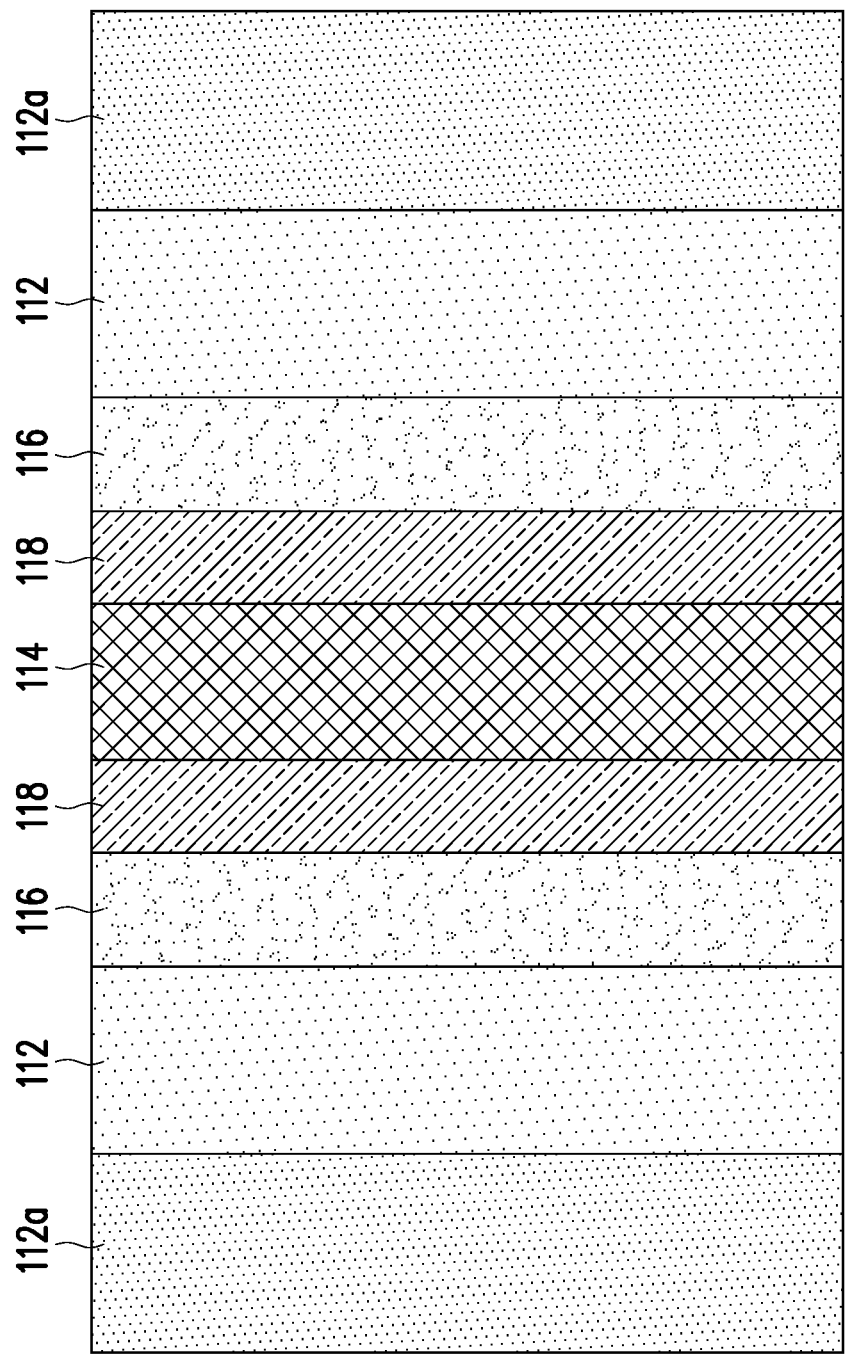

PHOTODETECTION DEVICE AND MANUFACTURING METHOD THEREOF

BACKGROUND

Photodetection plays a key role in optical sensing and communication applications. A photodetection device, such as a photodiode, converts an optical signal into an electric signal. The p-n junction in a photodiode is typically reverse biased, thereby forming a relatively wide depletion region. The current through the reverse-biased p-n junction will be a function of the optically-generated electron-hole pairs. Carriers resulting from an electron-hole pair formation in the depletion region are swept out by the electric field resulting from the reverse bias, thereby providing a rapid response.

With proper doping and reverse biasing, the carriers resulting from an electron-hole formation cause impact ionization of other carriers in a multiplication region, a process denoted as avalanche breakdown. Photodiodes configured for such breakdown are denoted as avalanche photodiodes. Because a single optically-induced carrier may produce many additional avalanche-ionized carriers, the resulting photocurrent gain makes avalanche photodiodes very sensitive and high-speed optical detectors. However, the avalanche breakdown process is inherently noisy. The reverse bias may be raised to minimize the noise, but current gain of the avalanche photodiode may be compromised as a result of the increased reverse bias.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1B is a schematic plan view illustrating the absorption structure, the charge layer, the charge multiplication regions and the anodes of the photodetection device as shown in FIG. 1A.

DETAILED DESCRIPTION

Figure 1A:
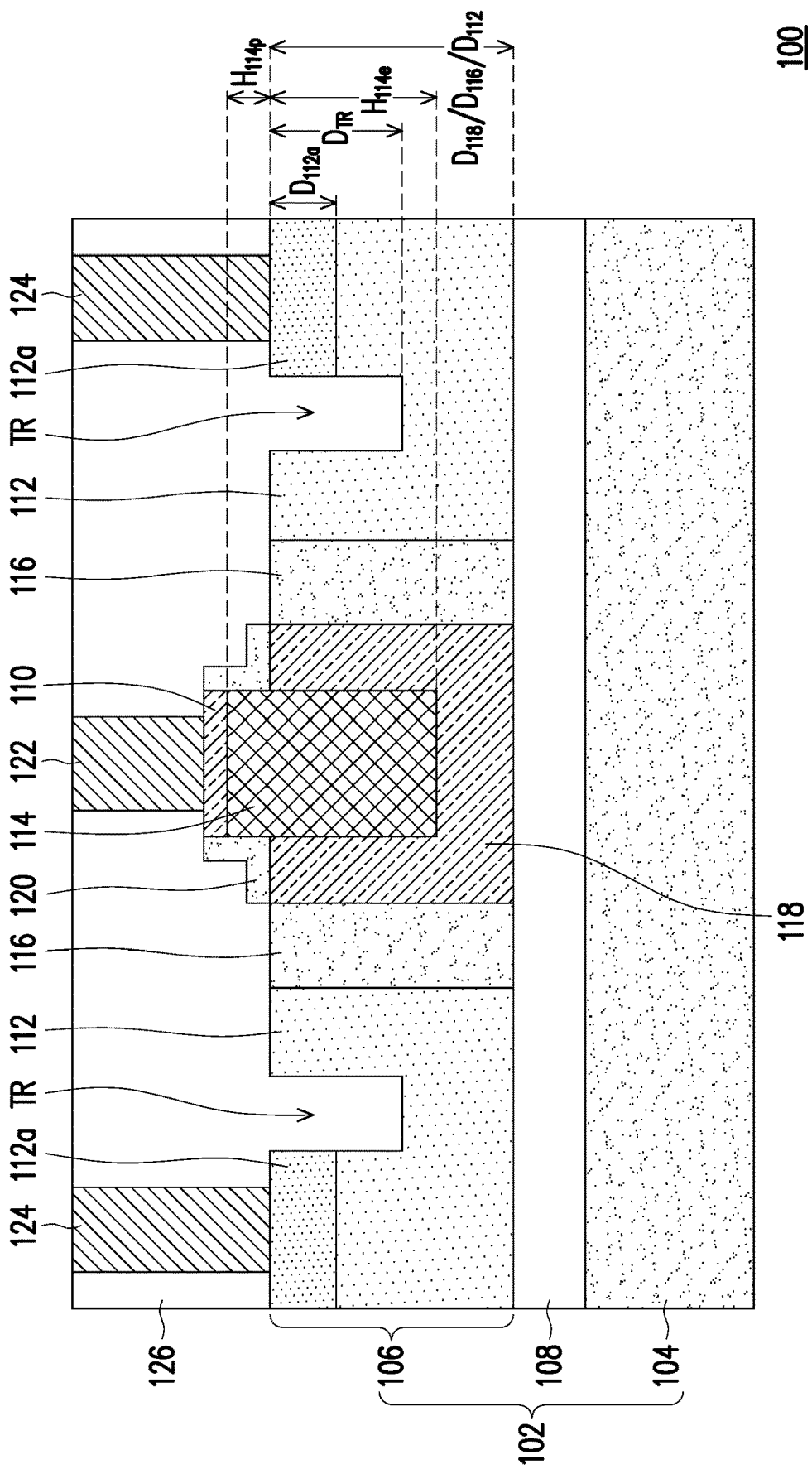
FIG. 1A is a schematic cross-sectional view illustrating a photodetection device according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic cross-sectional view illustrating a photodetection device 100 according to some embodiments of the present disclosure.

Referring to FIG. 1A, the photodetection device 100 is an avalanche photodiode. The photodetection device 100 is configured to receive a large reverse bias voltage (near a breakdown voltage). In corresponding to incident light, electron-hole pairs may form in a light absorption region of the photodetection device 100, and carriers resulting from formation of the electron-hole pairs may be accelerated by the strong electrical field caused by the large reverse bias voltage, so as to collide with and thereby ionize other atoms. Such collision results in additional carriers, and these additional carrier are also accelerated to release more carriers. This chain reaction may be referred as a charge multiplication process. Because a single optically-induced carrier may produce many additional avalanche-ionized carriers, sensitivity of the photodetection device 100 may be very high.

The photodetection device 100 may be formed on a surface region of a semiconductor substrate 102. In some embodiments, the semiconductor substrate 102 is a semiconductor-on-insulator (SOI) substrate. In these embodiments, the semiconductor substrate 102 includes a back semiconductor layer 104, a front semiconductor layer 106 and a buried insulating layer 108 sandwiched between the back semiconductor layer 104 and the front semiconductor layer 106, and the photodetection device 100 may be built in the front semiconductor layer 106. As an example, the semiconductor substrate 102 may be a silicon-on-insulator wafer, and the back and front semiconductor layers 104, 106 may respectively include silicon. On the other hand, the buried insulating layer 108 is formed of an insulating material, such as silicon oxide.

The photodetection device 100 includes a cathode 110 and at least one anode 112, and light absorption and charge multiplication may take place between the cathode 110 and the anode 112. A conductive type of the cathode 110 may be complementary to a conductive type of the anode 112. In some embodiments, the cathode 110 is P-type, while the anode 112 is N-type. During operation of the photodetection device 100, the cathode 110 and the anode 112 are configured to receive a large reverse bias voltage. For instance, the anode 112 of N-type is configured to receive a large positive voltage, while the cathode 110 of P-type is grounded or configured to receive a reference voltage. As a result of the reverse bias voltage, the electrons generated during the charge multiplication process may be drawn to the anode 112, while the holes generated during the charge multiplication process may be drawn to the cathode 112. Accordingly, current may be regarded as flowing from the anode 112 to the cathode 110. In some embodiments, the photodetection device 100 includes a cathode 110 and two anodes 112 at opposite sides of the cathode 110. In these embodiments, current may flow to the cathode 110 from the two anodes 112 at opposite sides of the cathode 110. As will be further described, the cathode may be a doped region formed in a capping layer deposited over the front semiconductor layer 106 of the semiconductor substrate 102, while the anodes 112 may be doped regions in the front semiconductor layer 106 of the semiconductor substrate 102.

In some embodiments, the photodetection device 100 has a separate absorption charge and multiplication (SACM) design, such that the light absorption and the charge multiplication take place at different regions of the photodetection device 100. In these embodiments, the light absorption may take place in an absorption structure 114 formed in a recess at a top surface of the front semiconductor layer 106. On the other hand, the charge multiplication may take place in portions of the semiconductor substrate 102 (e.g., portions of the front semiconductor layer 106 of the semiconductor substrate 102) at opposite sides of the absorption structure 114, and these portions of the semiconductor substrate 102 (e.g., the portions of the front semiconductor layer 106) may be referred as charge multiplication regions 116. The absorption structure 114 may be an epitaxial structure, and may be formed of a semiconductor material with a bandgap lower than a bandgap of the semiconductor material of the front semiconductor layer 106, in order to improve the light absorption of the photodetection device 100. For instance, the front semiconductor layer 106 may be a silicon layer, and the absorption structure 114 may be formed of germanium or a group III-V semiconductor material. In addition, the absorption structure 114 may be in contact with the cathode 110 from below the cathode 110. In other words, a top surface of the absorption structure 114 may be covered by the cathode 110. In some embodiments, the absorption structure 114 may protrude from the top surface of the front semiconductor layer 106, such that a top portion of the absorption structure 114 is above the top surface of the front semiconductor layer 106. On the other hand, the rest portion of the absorption structure 114 is embedded in the front semiconductor layer 106, and in lateral contact (e.g., indirect lateral contact) with the charge multiplication regions 116. In some embodiments, the absorption structure 114 slightly protrudes from the top surface of the front semiconductor layer 106. For instance, a height $H_{114e}$ of the embedded portion of the absorption structure 114 may be about 175 nm, and a height $H_{114p}$ of the protruded portion of the absorption structure 114 may be about 75 nm. Further, in some embodiments, the charge multiplication regions 116 are formed of an intrinsic semiconductor material. In those embodiments where the front semiconductor layer 106 is a silicon layer, the charge multiplication regions 116 may be formed of intrinsic silicon. In addition, in some embodiments, the charge multiplication regions 116 respectively extend from a bottom surface of the front semiconductor layer 106 (i.e., a top surface of the buried insulating layer 108) to the top surface of the front semiconductor layer 106.

In some embodiments, a charge layer 118 is disposed between the absorption structure 114 and the charge multiplication regions 116. In these embodiments, the charge multiplication regions 116 are in lateral contact with the embedded portion of the absorption structure 114 through the charge layer 118. A role of the charge layer 118 is to control electric field inside the photodetection device 100. Specifically, an electric field in the absorption structure 114 should be well below a breakdown field of the absorption structure 114, even when the photodetection device 100 is biased near limit of its operation (i.e., breakdown in the charge multiplication regions 116). On the other hand, the charge layer 118 is also functioned for ensuring a high electric field in the charge multiplication regions 116. In some embodiments, the charge layer 118 is a P-type doped region in the front semiconductor layer 106, and the electric fields in the absorption structure 114 and the charge multiplication regions 116 may be tuned by altering doping concentration of the charge layer 118. For instance, a doping concentration of the charge layer 118 may range from $10^{17}$ $cm^{-3}$ to $10^{19}$ $cm^{-3}$. In addition, in these embodiments, the charge layer 118 may extend to the top surface of the front semiconductor layer 106 from, for example, the bottom surface of the front semiconductor layer 106 (i.e., the top surface of the buried insulating layer 108), and the embedded portion of the absorption structure 114 is located in a recess at a top surface of the charge layer 118. Accordingly, opposite sidewalls of the embedded portion of the absorption structure 114 may be entirely covered by the charge layer 118. As compared to an avalanche photodiode of which a charge layer is a deep well with a top end distant from a top surface of a semiconductor substrate, the charge layer 118 has taller wall portions that are in lateral contact with the absorption structure 114 from opposite sides of the absorption structure 114. Consequently, the charge multiplication regions 116 in lateral contact with the absorption structure 114 through the charge layer 118 respectively has a larger surface (i.e., larger sidewall) in contact with the charge layer 118. As a result, more carriers (e.g., electrons) may be swiped into the charge multiplication regions 116 through such large contact surface, and a multiplication factor (also referred as gain) of the charge multiplication taking place in the charge multiplication regions 116 can be improved. Such improvement is particularly important when the reverse bias voltage applied to the cathode 110 and the anodes 112 is raised to minimize noise accompany with the charge multiplication, since the multiplication factor is otherwise limited when the reverse bias voltage is increased. In those embodiments where the charge multiplication regions 116 and the charge layer 118 both extend from the bottom surface to the top surface of the front semiconductor layer 106 of the semiconductor substrate 102, a depth $D_{118}$ of the charge layer 118 and a depth $D_{116}$ of the charge multiplication regions 116 may be substantially equal to a thickness of the front semiconductor layer 106.

In some embodiments, exposed surfaces of the charge layer 118 and the absorption structure 114 are covered by a capping layer 120. The exposed surfaces of the charge layer 118 and the absorption structure 114 may be passivated by the capping layer 120. In some embodiments, the capping layer 120 conformally covers the exposed surfaces of the charge layer 118 and the absorption structure 114. The capping layer 120 may be a semiconductor layer, and the cathode 110 may be a doped region in the capping layer 120. A top surface of the protruded portion of the absorption structure 114 may be covered by the doped region of the capping layer 120 (i.e., the cathode 110), while opposite sidewalls of the protruded portion of the absorption structure 114 as well as a top surface of the charge layer 118 may be covered by rest portion of the capping layer 120, which may be intrinsic. In some embodiments, the capping layer 120 and the front semiconductor layer 106 are formed of the same semiconductor material, such as silicon. Further, in some embodiments, a thickness of the capping layer 120 ranges from 10 nm to 100 nm.

In some embodiments, the anodes 112 are doped regions in the front semiconductor layer 106, and are laterally separated from the charge layer 118 by the charge multiplication regions 116. A conductive type of the anodes 112 is complementary to the conductive type of the charge layer 118 and the cathode 110. In those embodiments where the charge layer 118 and the cathode 110 are P-type, the anodes 112 are N-type. In some embodiments, each anode 112 has a heavily doped region 112a functioned as a contact area of the anode 112. Each heavily doped region 112a is formed in a shallow portion of the corresponding anode 112, and has a doping concentration greater than a doping concentration of rest portion of the anode 112. For instance, the doping concentration of the heavily doped region 112a may range from $10^{19}$ cm$^{-3}$ to $10^{21}$ cm$^{-3}$, while the doping concentration of the rest portion of the anodes 112 may range from $10^{17}$ cm$^{-3}$ to $10^{19}$ cm$^{-3}$. In some embodiments, the anodes 112 extend from the bottom surface of the front semiconductor layer 106 (i.e., the top surface of the buried insulating layer 108) to the top surface of the front semiconductor layer 106. In those embodiments where the charge multiplication regions 116 and the charge layer 118 also extend from the bottom surface to the top surface of the front semiconductor layer 106, a total depth $D_{112}$ of the anodes 112 may be substantially equal to the depth Dim of the charge multiplication regions 116 and the depth $D_{118}$ of the charge layer 118, and each may be substantially equal to the thickness of the front semiconductor layer 106. Further, a depth $D_{112a}$ of the heavily doped regions 112a that is less than the total depth $D_{112}$ may range from 10 nm to 30 nm. In addition, in some embodiments, a trench TR is formed at a top surface of each anode 112 (i.e., the top surface of the front semiconductor layer 106). The trench TR may be disposed aside the heavily doped region 112a, and an edge of the heavily doped region 112a may be defined by a sidewall of the trench TR. Further, the trench TR may be laterally spaced apart from the charge layer 118 by a portion of the anode 112. In some embodiments, a depth $D_{TR}$ of the trench TR is greater than the depth $D_{112a}$ of the heavily doped regions 112a, but less than a total depth Diu of the anodes 112.

In some embodiments, the photodetection device 100 further includes a cathode contact plug 122 and at least one anode contact plug 124. The cathode 110 can be out routed through the cathode contact plug 122, while the at least one anode 112 can be out routed through the at least one anode contact plug 124. The cathode contact plug 122 stands on the cathode 110, and electrically connects to the cathode 110. On the other hand, the at least one anode contact plug 124 stands on the at least one anode 112, and electrically connects to the at least one anode 112. In those embodiments where the photodetection device 100 has two anodes 112, two anode contact plugs 124 are respectively disposed on one of the anodes 112. Further, the anode contact plugs 124 may be respectively disposed on the heavily doped region 112a of one of the anodes 112. In some embodiments, top surfaces of the cathode contact plug 122 and the anode contact plugs 124 are substantially coplanar with one another. In these embodiments, since the cathode contact plug 122 stands on the cathode 110 lying on the portion of the absorption structure 114 protruded from the top surface of the semiconductor substrate 102 (e.g., the top surface of the front semiconductor layer 106 of the semiconductor substrate 102), the cathode contact plug 122 may be shorter than the anode contact plugs 124 that stand on the top surface of the semiconductor substrate 102 (e.g., the top surface of the front semiconductor layer 106 of the semiconductor substrate 102). The cathode contact plug 122 and the anode contact plug(s) 124 are formed of a conductive material, such as tungsten, copper or the like.

In some embodiments, a dielectric layer 126 is formed on the semiconductor substrate 102. The dielectric layer 126 may laterally surround the cathode contact plug 122 and the anode contact plug(s) 124, and cover the top surface of the semiconductor substrate 102 (e.g., the top surface of the front semiconductor layer 106 of the semiconductor substrate 102) as well as portions of the capping layer 120 not overlapped with the cathode contact plug 122. In those embodiments where the trenches TR are formed at the top surfaces of the anodes 112, the trenches TR may be filled by the dielectric layer 126. Further, in some embodiments, a top surface of the dielectric layer 126 is substantially coplanar with the top surfaces of the cathode contact plug 122 and the anode contact plug(s) 124. The dielectric layer 126 may be formed of a dielectric material, such as silicon oxide, borophosphosilicate glass (BPSG), tetraethyl orthosilicate (TEOS), spin-on glass (SOG), undoped silicate glass (USG), fluorosilicate glass (FSG), high-density plasma (HDP) oxide, plasma enhanced TEOS (PETEOS), the like or combinations thereof.

FIG. 1B is a schematic plan view illustrating the absorption structure 114, the charge layer 118, the charge multiplication regions 116 and the anodes 112 of the photodetection device 100 as shown in FIG. 1A. It should be noted that, the capping layer 120 (also the cathode 110 therein) as well as the contact plugs (e.g., including the cathode contact plug 122 and the anode contact plugs 124) are omitted in FIG. 1B.

Referring to FIG. 1A and FIG. 1B, according to some embodiments, the charge layer 118 is formed in line shape, and the absorption structure 114 is filled in a trench defined at a top surface of the charge layer 118 and extending along the charge layer 118 in line shape. In these embodiments, at least one of the opposite ends of the absorption structure 114 in line shape may extend to a boundary of the photodetection device 100, thus such end of the absorption structure 114 can be functioned as an optical input of the photodetection device 100. As shown in FIG. 1B, both ends of the absorption structure 114 in line shape extend to the boundary of the photodetection device 100. Further, the charge multiplication regions 116 and the anodes 112 at opposite sides of the charge layer 118 in line shape may extend along the charge layer 118. In other words, the charge multiplication regions 116 and the anodes 112 may respectively be in line shape as well, and may extend to the boundary of the photodetection device 100. In some embodiments, as shown in FIG. 1B, the heavily doped regions 112a in the anodes 112 are respectively formed in line shape extending along the anodes 112 also in line shape. In these embodiments, the heavily doped regions 112a may extend to the boundary of the photodetection device 100. In alternative embodiments, the heavily doped regions 112a may respectively be formed in patch shape (e.g., rectangular patch or circular patch), and may be at least partially surrounded by rest portions of the anodes 112.

Although not shown in FIG. 1B, the capping layer 120 may extend along the underlying charge layer 118 in line shape, and the cathode 110 as a portion of the capping layer 120 may extend along the absorption structure 114 formed in a trench at the top surface of the charge layer 118. Accordingly, the cathode 110 as well as rest portions of the capping layer 120 may respectively be formed in line shape. However, according to process and design requirements, the cathode 110 may be formed in other shapes, as long as the protruded portion of the absorption structure 114 could be fully covered by the cathode 110 and the rest portions of the capping layer 120.

Figure 2A:
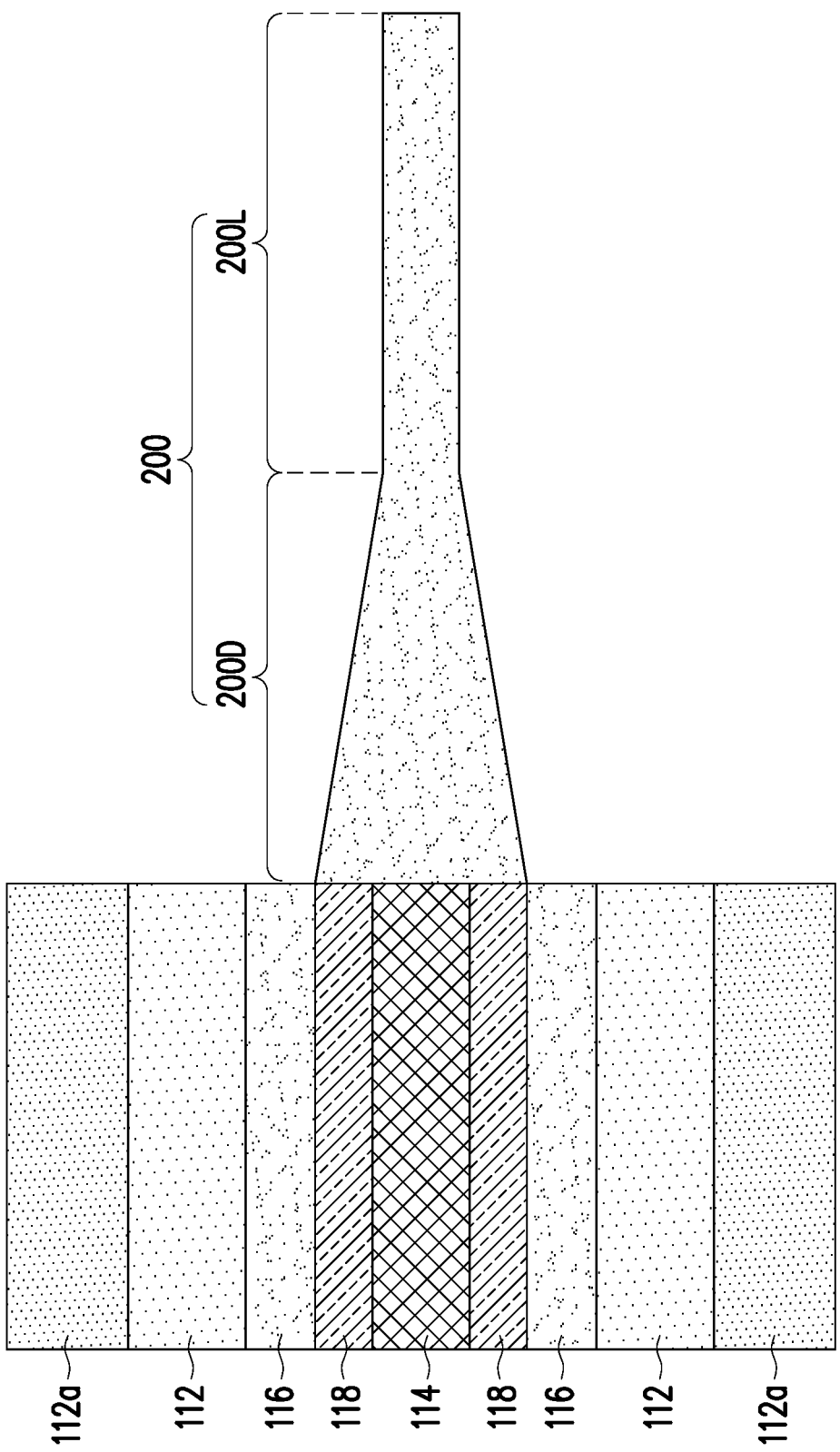
FIG. 2A is a schematic plan view illustrating a waveguide coupled to the photodetection device according to some embodiments of the present application.

FIG. 2A is a schematic plan view illustrating a waveguide 200 coupled to the photodetection device 100 according to some embodiments of the present application. It should be noted that, the capping layer 120 (also the cathode 110 therein) as well as the contact plugs (e.g., including the cathode contact plug 122 and the anode contact plugs 124) are omitted in FIG. 1B.

Referring to FIG. 2A, a waveguide 200 may be optically coupled to the absorption structure 114. In some embodiments, one of the opposite ends of the absorption structure 114 in line shape is in lateral contact with the waveguide 200. Such end of the absorption structure 114 may be entirely in contact with the waveguide 200. Further, a portion of the charge layer 118 covering sidewalls and a bottom surface of such end of the absorption structure 114 may be in lateral contact with the waveguide 200 as well. In some embodiments, the waveguide 200 has a line portion 200L and a divergent portion 200D. The waveguide 200 is connected to the photodetection device 100 by a wide end of the divergent portion 200D, and a narrow end of the divergent portion 200D is connected to an end of the line portion 200L. A width of the line portion 200L is substantially constant along an extension direction of the line portion 200L, while a width of the divergent portion 200D gradually increases toward the photodetection device 100.

Figure 2B:
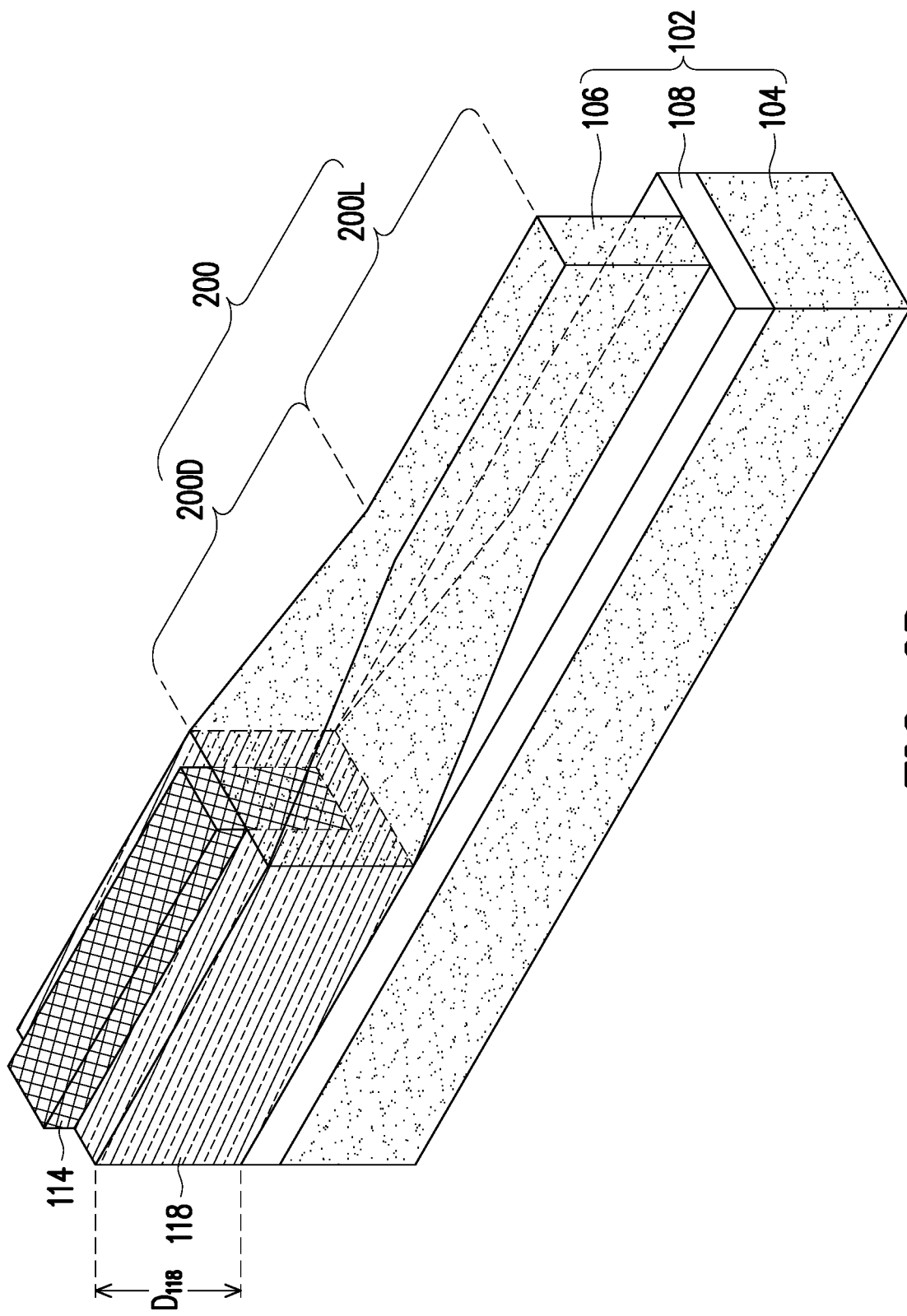
FIG. 2B is a schematic three-dimensional view illustrating the waveguide and a portion of the photodetection device connected to the waveguide as shown in FIG. 2A.

FIG. 2B is a schematic three-dimensional view illustrating the waveguide 200 and a portion of the photodetection device 100 connected to the waveguide 200.

Referring to FIG. 2A and FIG. 2B, in some embodiments, the waveguide 200 is formed by shaping the front semiconductor layer 106 of the semiconductor substrate 102. In these embodiments, the waveguide 200 is formed of the material of the front semiconductor layer 106 (e.g., silicon), and a thickness of the waveguide 200 is substantially identical with a thickness of the front semiconductor layer 106. In addition, the depth $D_{118}$ of the charge layer 118 may be substantially equal to the thickness of the waveguide 200, and a topmost surface of the charge layer 118 may be substantially coplanar with a top surface of the waveguide 200. Accordingly, a top surface of the portion of the absorption structure 114 protruding from the topmost surface of the charge layer 118 may be higher than the top surface of the waveguide 200. Although not shown in FIG. 2B, the dielectric layer 126 as described with reference to FIG. 1A may cover sidewalls and the top surface of the waveguide 200, and the waveguide 200 may be wrapped by the dielectric layer 126 and the buried insulating layer 108 of the semiconductor substrate 102.

Figure 3:
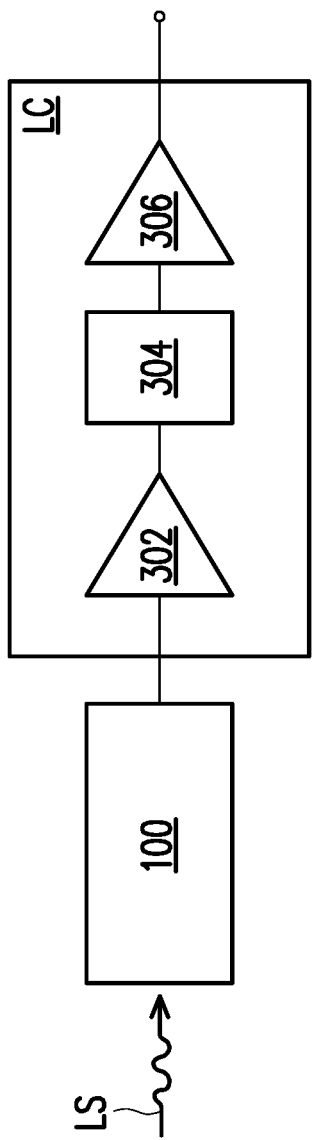
FIG. 3 is a block diagram illustrating an optical receiver according to some embodiments of the present application.

FIG. 3 is a block diagram illustrating an optical receiver 300 according to some embodiments of the present application.

Referring to FIG. 3, the optical receiver 300 includes the photodetection device 100 as described with reference to FIG. 1A and FIG. 1B. The photodetection device 100 is configured to receive a light signal LS provided through, for example, the waveguide 200 as described with reference to FIG. 2A and FIG. 2B, and is operated under a strong reverse bias. The light signal LS can be converted to a current signal, and output by the photodetection device 100. In some embodiments, the current signal is output through the cathode 110 of the photodetection device 100, which is described with reference to FIG. 1A. A transimpedance amplifier (TIA) 302 is coupled to the output of the photodetection device 100, and is configured to convert the current signal to a voltage signal of considerable magnitude. In some embodiments, the TIA 302 is a first block of a linear channel LC for processing the current signal. The linear channel LC may further include a filter 304 and an additional amplifier 306 coupled to an output of the TIA 302. The filter 304 is configured to shape the voltage signal for noise reduction, and the additional amplifier 306 is configured to boost an output voltage of the TIA 302. Although the additional amplifier 306 is depicted as coupled to an output of the filer 304, the additional amplifier 306 may be alternatively coupled to the output of the TIA 302, while the filter 304 is coupled to an output of the additional amplifier 306. In other embodiments, the filter 304 and the additional amplifier 306 may be omitted. At an output of the linear channel LC, the provided output voltage can be later used by either signal processing or a decision circuit.

Figure 4:
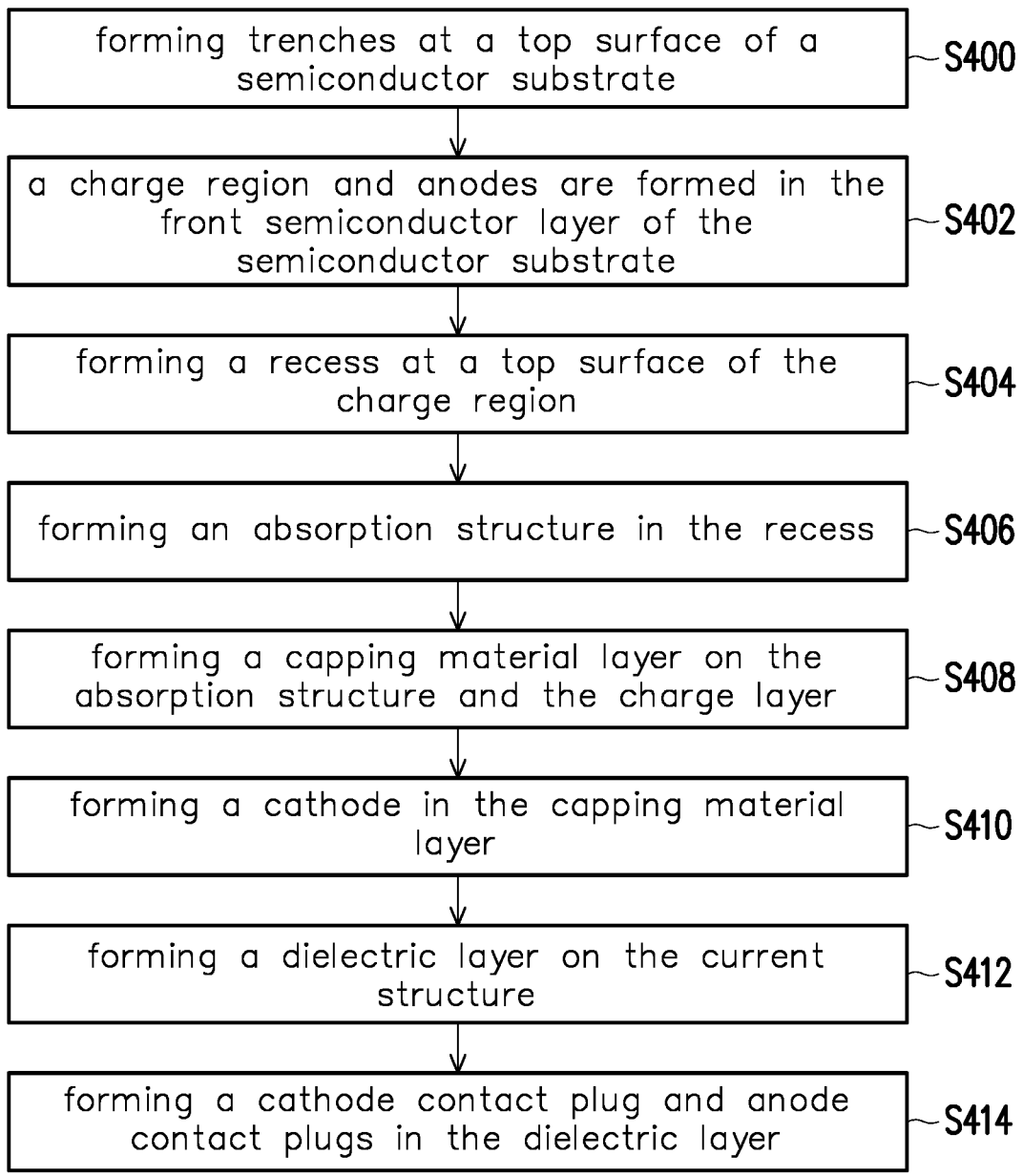
FIG. 4 is a flow diagram illustrating a manufacturing method for forming the photodetection device 100 as shown in FIG. 1A, according to some embodiments of the present disclosure.

FIG. 4 is a flow diagram illustrating a manufacturing method for forming the photodetection device 100 as shown in FIG. 1A, according to some embodiments of the present disclosure. FIG. 5A through FIG. 5G are schematic cross-sectional views illustrating intermediate structures at various stages during the manufacturing process of the photodetection device 100 as shown in FIG. 4.

Figure 5A:
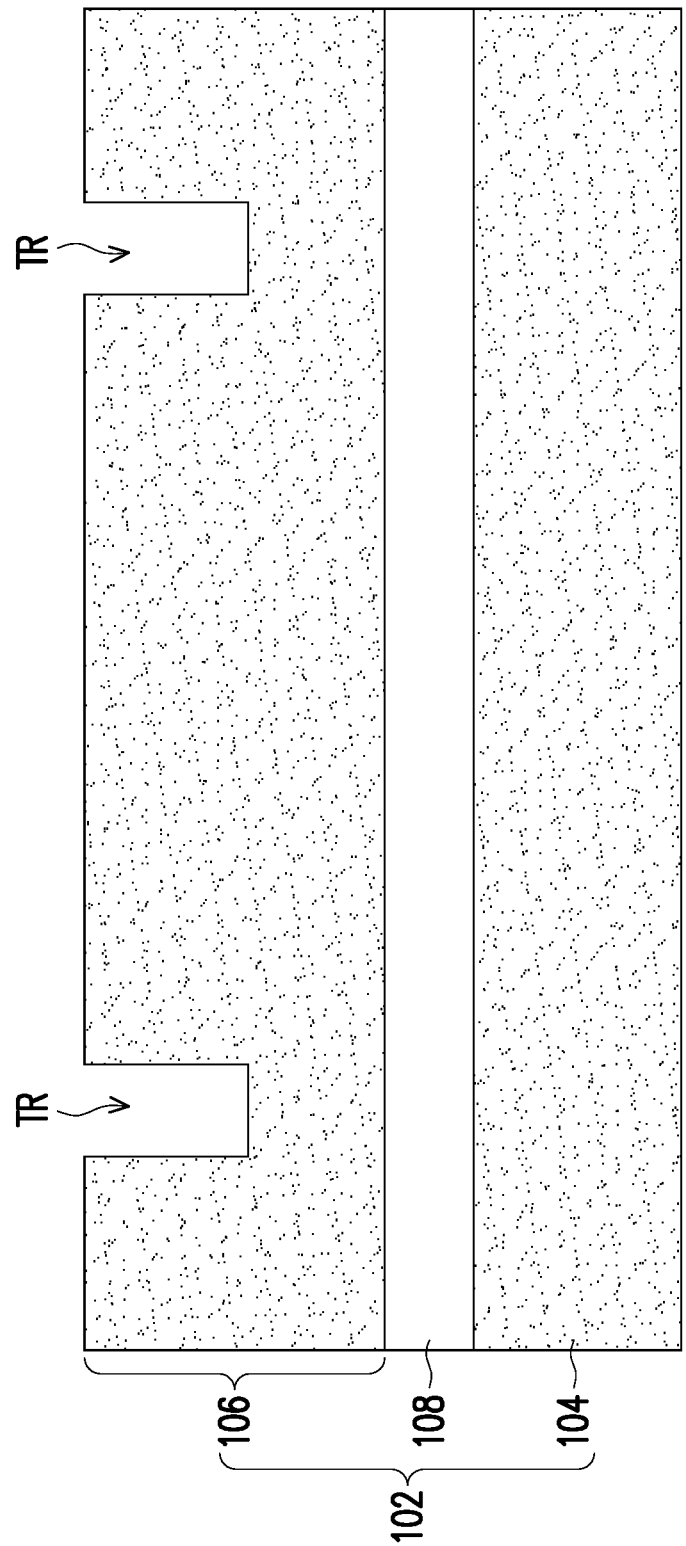
FIG. 5A through FIG. 5G are schematic cross-sectional views illustrating intermediate structures at various stages during the manufacturing process of the photodetection device as shown in FIG. 4.

Referring to FIG. 4 and FIG. 5A, step S400 is performed, and the trenches TR are formed at the top surface of the semiconductor substrate 102. The trenches TR extend into the front semiconductor layer 106 of the semiconductor substrate 102 from the top surface of the front semiconductor layer 106. In some embodiments, a method for forming the trenches TR includes a lithography process and an etching process (e.g., an anisotropic etching process).

Figure 5B:
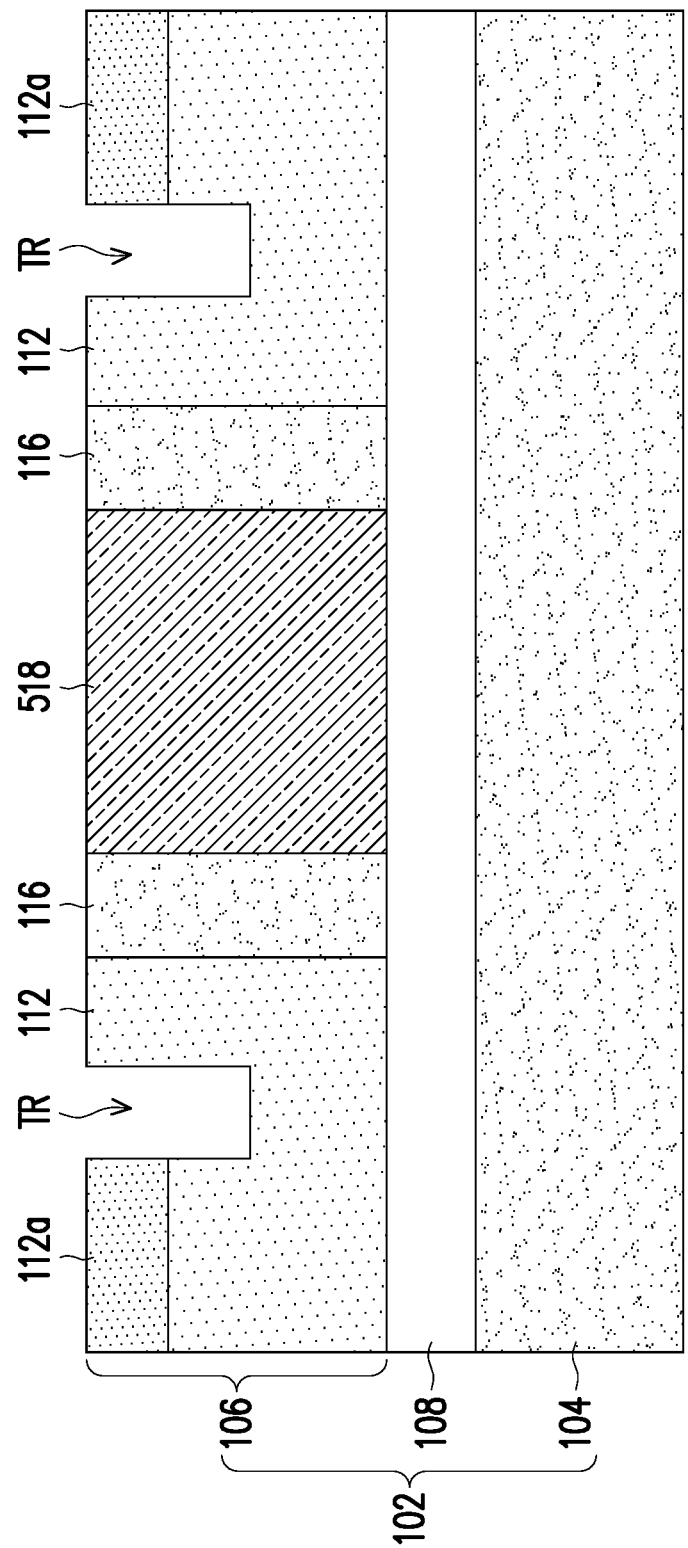

Referring to FIG. 4 and FIG. 5B, step S402 is performed, and a charge region 518 as well as the anodes 112 are formed in the front semiconductor layer 106 of the semiconductor substrate 102. The charge region 518 will be patterned to form the charge layer 118 as described with reference to FIG. 1A and FIG. 1B. In some embodiments, a method for forming the charge region 518 includes a lithography process and an ion implantation process. On the other hand, each anode 112 includes one of the heavily doped regions 112a having a doping concentration greater than a doping concentration of rest portion of the anode 112. In some embodiments, a method for forming the anodes 112 includes a lithography process and an ion implantation process for forming initial doped regions having a relatively low doping concentration, and another lithography process as well as another ion implantation process for turning some portions of the initial doped regions into the heavily doped regions 112a. The heavily doped regions 112a and rest portions of the initial doped regions form the anodes 112. In some embodiments, the charge region 518 is formed before formation of the anodes 112. In alternative embodiments, the charge region 518 is formed after formation of the anodes 112. Furthermore, portions of the front semiconductor layer 106 between the anodes 112 and the charge region 518 form the charge multiplication regions 116 as described with reference to FIG. 1A and FIG. 1B.

Figure 5C:
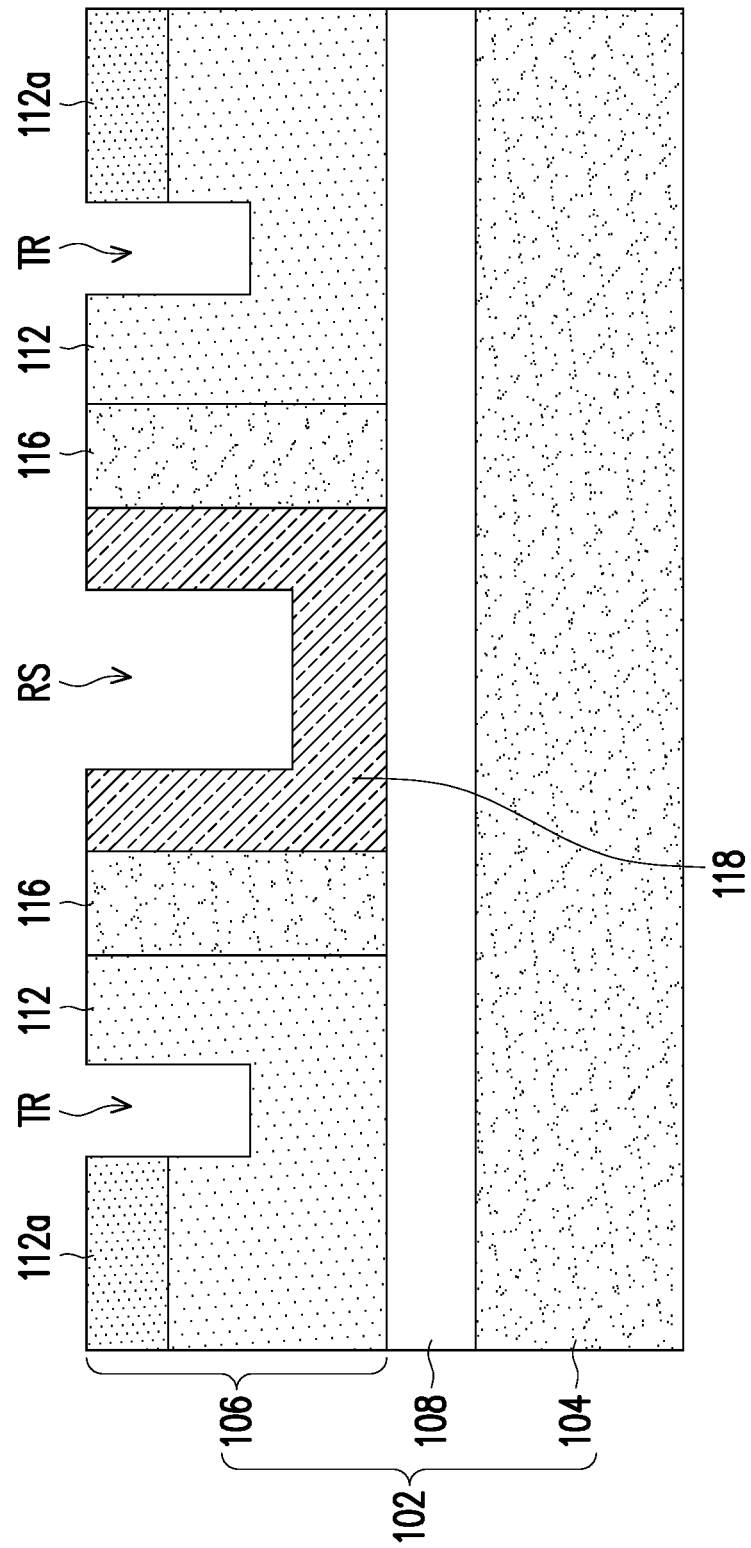

Referring to FIG. 4 and FIG. 5C, step S404 is performed, and a recess RS is formed at a top surface of the charge region 518. The recess RS is configured to accommodate the absorption structure 114 to be formed in the following step.

In some embodiments, a method for forming the recess RS includes a lithography process and an etching process (e.g., an anisotropic etching process).

Figure 5D:
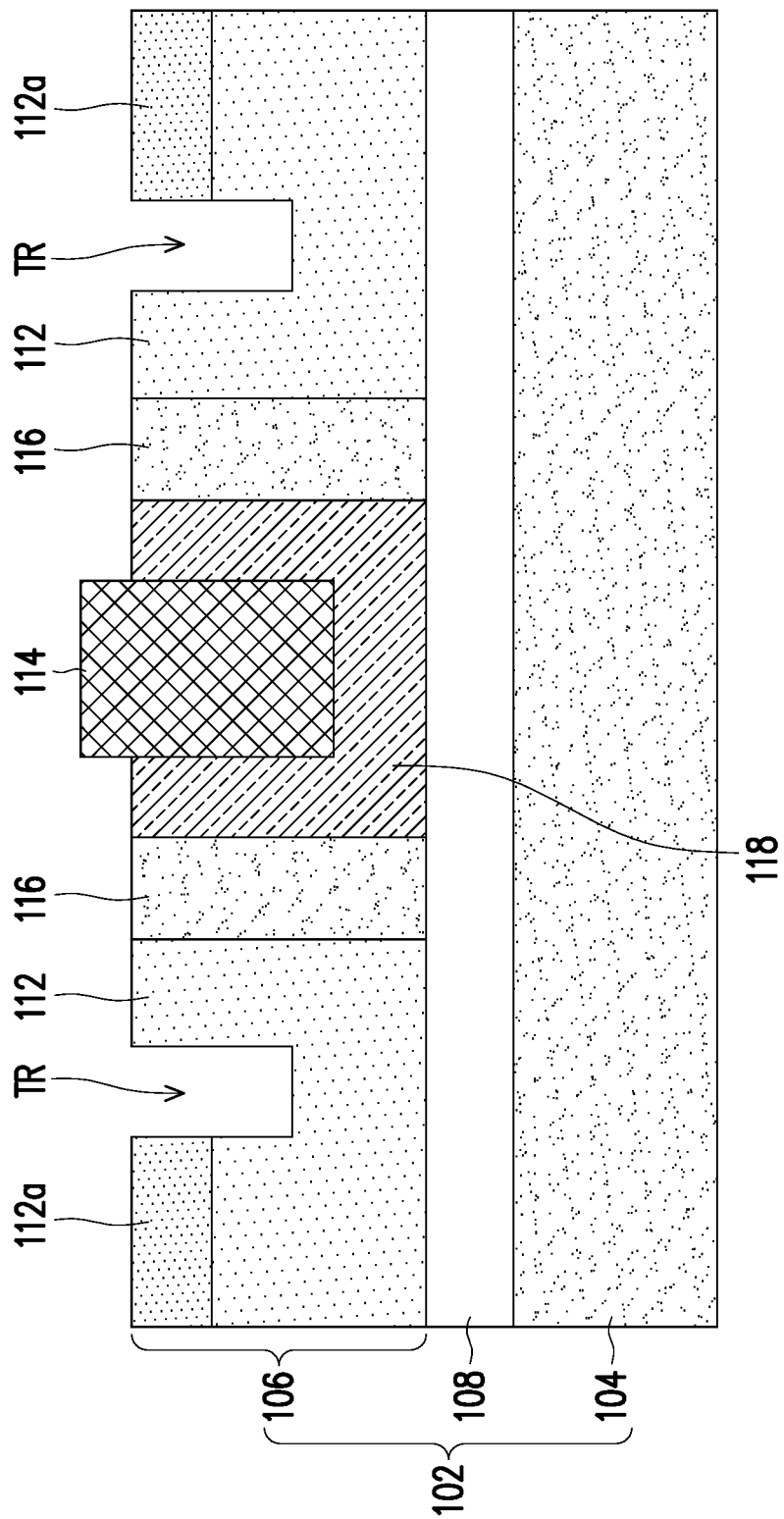

Referring to FIG. 4 and FIG. 5D, step S406 is performed, and the absorption structure 114 is formed in the recess RS. In some embodiments, a method for forming the absorption structure 114 includes an epitaxial process. It should be noted that, although the absorption structure 114 is depicted as having a rectangular cross-section with four right angles, the absorption structure 114 may be formed in other shapes, according to the epitaxial process and/or material selection for the absorption structure 114.

Figure 5E:
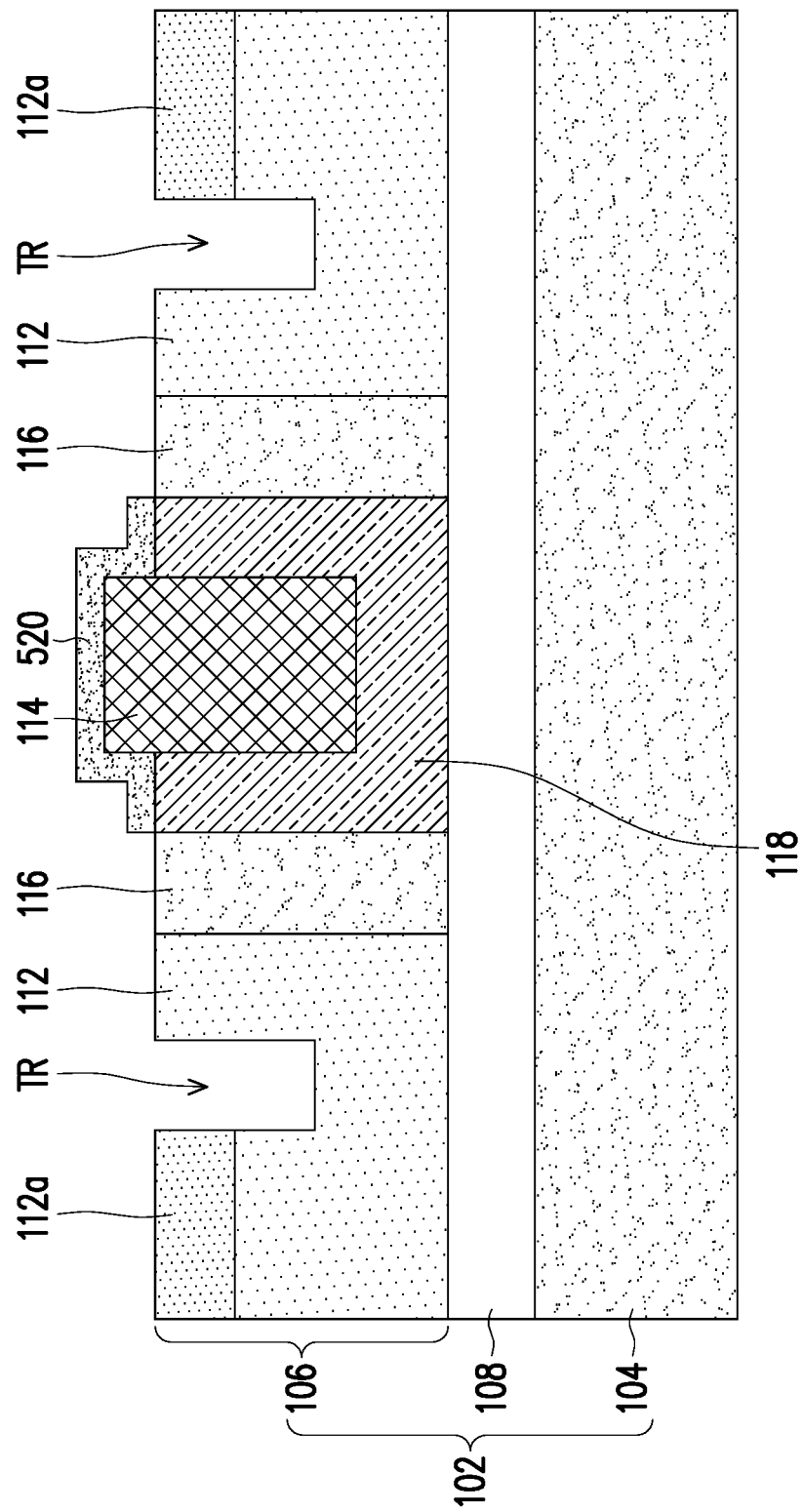

Referring to FIG. 4 and FIG. 5E, step S408 is performed, and a capping material layer 520 is formed on the absorption structure 114 and the charge layer 118. Exposed surfaces of the absorption structure 114 and the charge layer 118 are covered by the capping material layer 520. The cathode 110 described with reference to FIG. 1A will be formed in the capping material layer 520, and the cathode 110 as well as rest portion of the capping material layer 520 may form the capping layer 120 as described with reference to FIG. 1A. In some embodiments, a method for forming the capping material layer 520 includes forming a passivation layer (not shown, such as silicon oxide or silicon nitride) on the charge multiplication regions 116 and the anodes 112 by a deposition process, a lithography process and an etching process. Subsequently, the capping material layer 520 is selectively formed on the exposed surfaces of the absorption structure 114 and the charge layer 118 by an epitaxial process. The passivation layer may be remained in the final structure. Alternatively, the passivation layer may be removed by an etching process (e.g., an isotropic etching process). In other embodiments, a method for forming the capping material layer 520 includes globally forming a material layer on the structure shown in FIG. 5D by, for instance, an epitaxial process. Subsequently, the material layer is patterned to form the capping material layer 520 by a lithography process and an etching process (e.g., an anisotropic etching process).

Figure 5F:
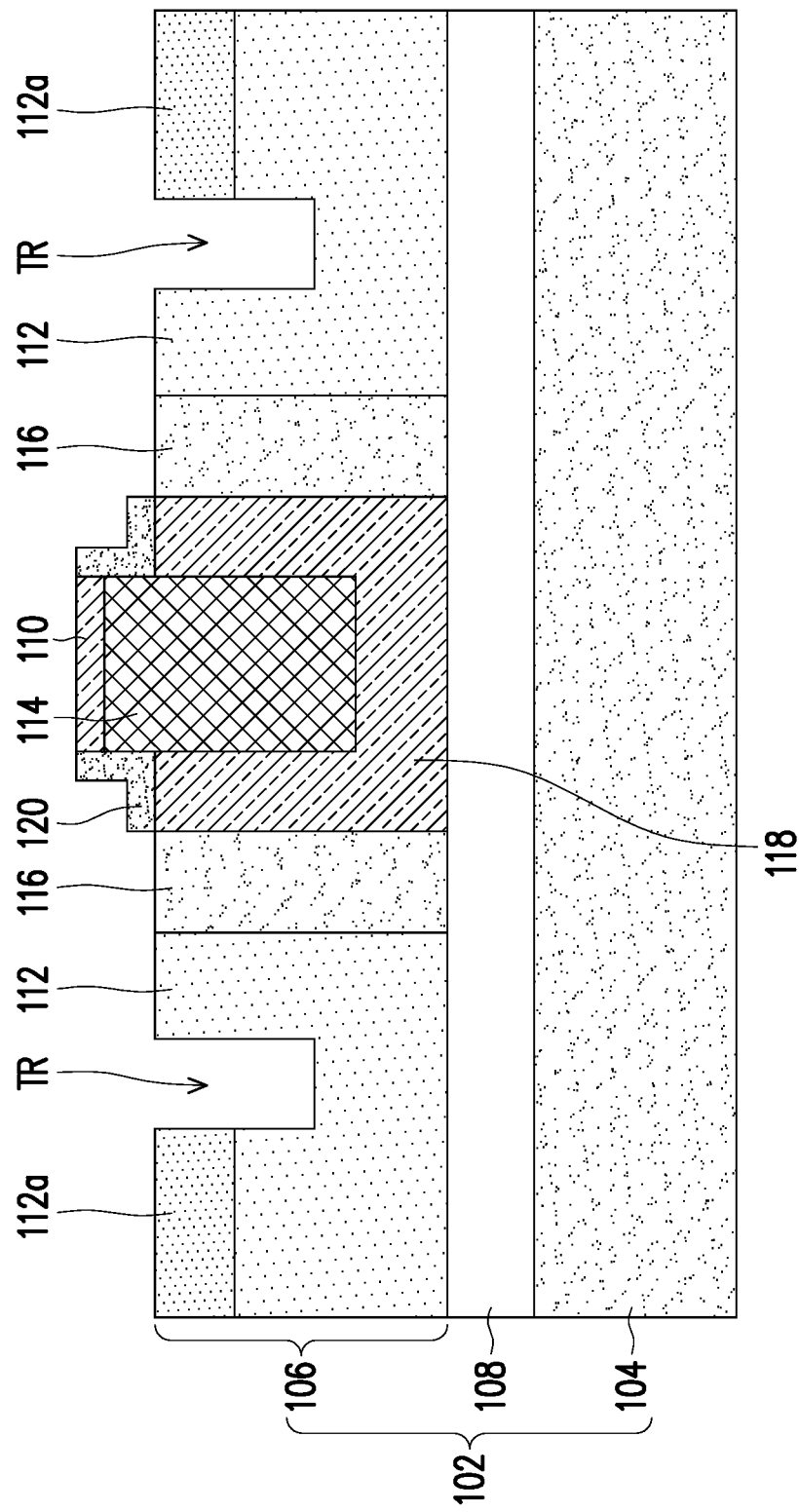

Referring to FIG. 4 and FIG. 5F, step S410 is performed, and the cathode 110 is formed in the capping material layer 520. A portion of the capping material layer 520 becomes the cathode 110, and the cathode 110 as well as rest portion of the capping material layer 520 form the capping layer 120 as described with reference to FIG. 1A. In some embodiments, a method for forming the cathode 110 includes a lithography process and an ion implantation process.

Figure 5G:
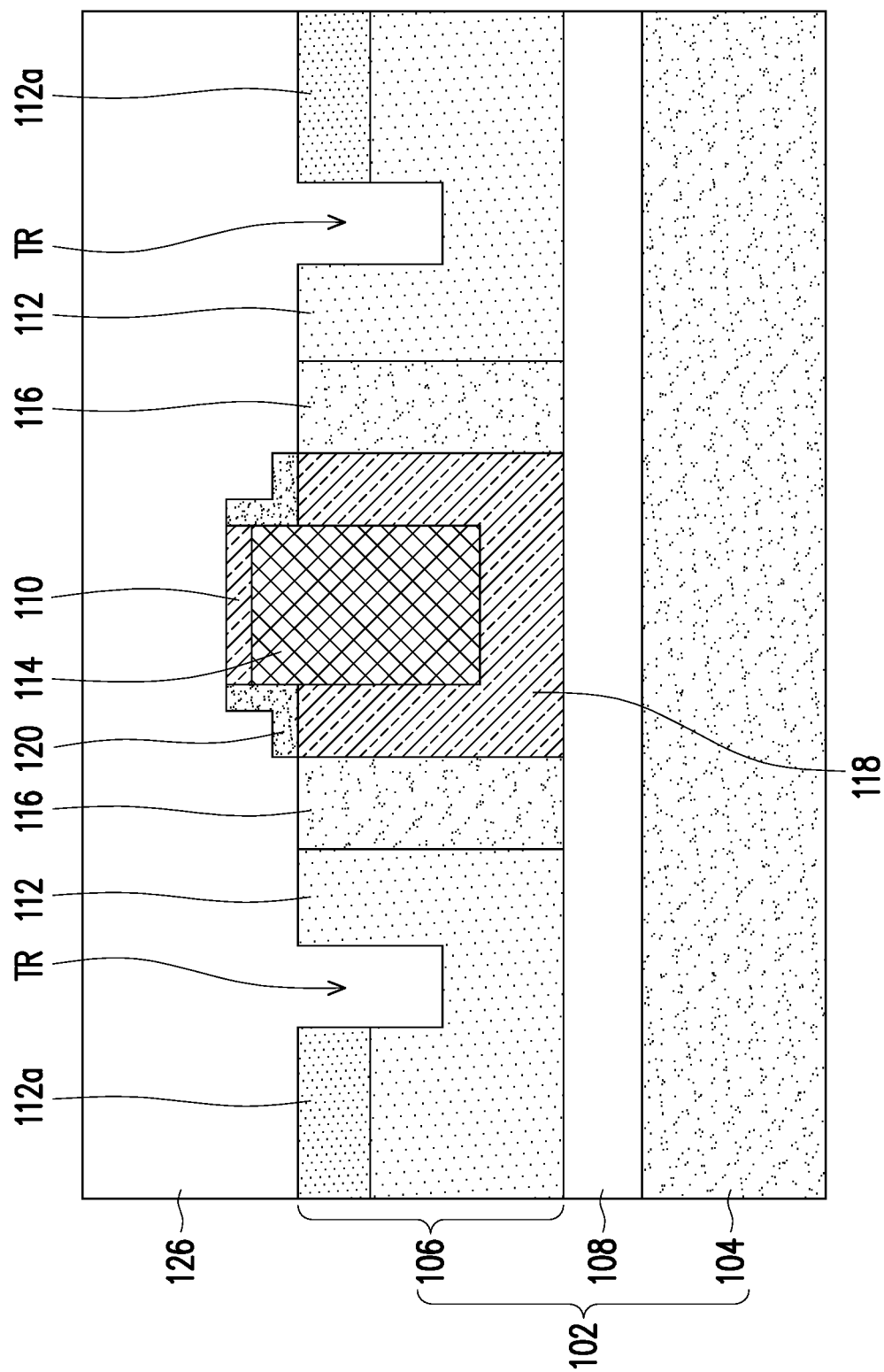

Referring to FIG. 4 and FIG. 5G, step S412 is performed, and the dielectric layer 126 is globally formed on the current structure. Top surfaces of the anodes 112, top surfaces of the charge multiplication regions 116 and exposed surface of the capping layer 120 (including the cathode 110) are covered by the dielectric layer 126. Further, the trenches TR may be filled up by the dielectric layer 126. In some embodiments, a method for forming the dielectric layer 126 includes a deposition process (e.g., a chemical vapor deposition (CVD) process), and may further include a planarization process. For instance, the planarization process may include a polishing process, an etching process or a combination thereof.

Referring to FIG. 4 and FIG. 1A, step S414 is performed, and the cathode contact plug 122 as well as the anode contact plugs 124 are formed in the dielectric layer 126. In some embodiments, a method for forming the cathode contact plug 122 and the anode contact plugs 124 includes forming through holes in the dielectric layer 126 by a lithography process and an etching process (e.g., an anisotropic etching process). Subsequently, a conductive material is provided on the current structure by a deposition process (e.g., a physical vapor deposition (PVD) process), a plating process or a combination thereof. The conductive material may fill up the through holes in the dielectric layer 126, and may further span on a top surface of the dielectric layer 126. Thereafter, portions of the conductive material above the dielectric layer 126 may be removed by a planarization process, and remained portions of the conductive material in the through holes form the cathode contact plug 122 and the anode contact plugs 124. For instance, the planarization process may include a polishing process, an etching process or a combination thereof.

Up to here, the photodetection device 100 as shown in FIG. 1A has been formed. The waveguide 200 as described with reference to FIG. 2A and FIG. 2B may be formed along with the photodetection device 100. Specifically, the waveguide 200 may be formed by patterning the front semiconductor layer 106 before formation of the dielectric layer 126. In addition, the structure including the photodetection device 100 (and the waveguide 200) may be further subjected to a back-end-of-line (BEOL) process for forming metallization layers configured to out rout the cathode 110 and the anodes 112 of the photodetection device 100, as well as a packaging process for forming a device die. In some embodiments, a circuit for driving the photodetection device 100 is integrated in the device die. In alternative embodiments, the driving circuit is formed in another device die bonded to or electrically coupled to the device die including the photodetection device 100.

Figure 6:
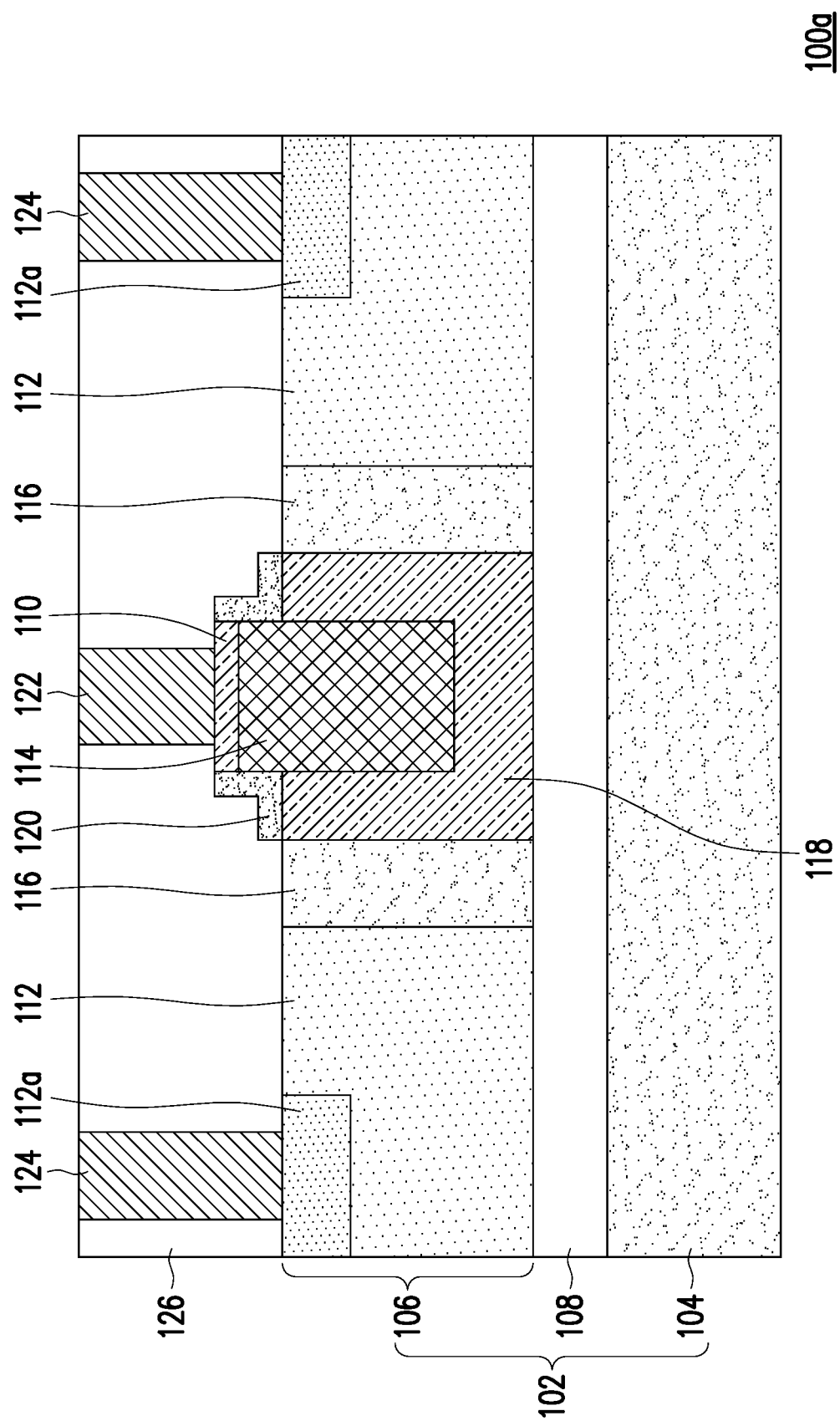
FIG. 6 is a schematic cross-sectional view of a photodetection device according to some embodiments of the present disclosure.

FIG. 6 is a schematic cross-sectional view of a photodetection device 100a according to some embodiments of the present disclosure.

Referring to FIG. 1 and FIG. 6, the photodetection device 100a shown in FIG. 6 is similar to the photodetection device 100 as shown in FIG. 1A, except that the trenches TR as shown in FIG. 1A may not be included in the photodetection device 100a as shown in FIG. 6. In embodiments shown in FIG. 6, the anodes 112 may respectively have a substantially flat top surface.

As above, the absorption structure is disposed in a recess at a top surface of the charge layer, and the charge layer is a doped region in the semiconductor substrate extending into the semiconductor substrate from a topmost surface of the semiconductor substrate. In addition, the charge multiplication regions, which are intrinsic portions of the semiconductor substrate extending into the semiconductor substrate from the topmost surface of the semiconductor substrate, are in lateral contact with the charge layer from opposite sides of the charge layer. Since the charge layer and the charge multiplication regions both extend into the semiconductor substrate from the topmost surface of the semiconductor substrate, the charge layer may have a larger area in lateral contact with the absorption structure, and the charge multiplication regions may respectively have a larger area in lateral contact with the charge layer. Consequently, more carriers (e.g., electrons) generated in the absorption structure can be swiped into the charge multiplication regions through the charge layer. Therefore, a multiplication factor (also referred as gain) of the charge multiplication taking place in the charge multiplication regions can be improved, particularly when the reverse bias voltage applied to the cathode and anode(s) of the photodetection device is further raised.

In an aspect of the present disclosure, a photodetection device is provided. The photodetection device comprises: an absorption structure, formed in a recess at a surface region of a semiconductor substrate, and configured to receive an incident light; a cathode, formed on a top surface of the absorption structure, and having a first conductive type; a charge multiplication layer, in lateral contact with the absorption structure, and being an intrinsic portion of the semiconductor substrate extending into the semiconductor substrate from a topmost surface of the semiconductor substrate; and an anode, in lateral contact with the charge multiplication layer from a side of the charge multiplication region away from the absorption structure, and being a doped region in the semiconductor substrate having a second conductive type complementary to the first conductive type.

In another aspect of the present disclosure, a photodetection device is provided. The photodetection device comprises: a semiconductor substrate, comprising a back semiconductor layer, a front semiconductor layer and a buried insulating layer sandwiched between the back and front semiconductor layers, wherein the front semiconductor layer has a recess extending into the front semiconductor layer from a topmost surface of the front semiconductor layer; an absorption structure, disposed in the recess, and configured to receive an incident light; a cathode, lying on a top surface of the absorption structure, and has a first conductive type; a charge multiplication region, being an intrinsic portion of the front semiconductor layer extending into the front semiconductor layer from the topmost surface of the front semiconductor layer, and in lateral contact with the absorption structure; and an anode, being a doped region in the front semiconductor layer extending into the front semiconductor layer from the topmost surface of the front semiconductor layer, and in lateral contact with the charge multiplication region from a side of the charge multiplication region away from the absorption structure, wherein the anode has a second conductive type complementary to the first conductive type.

In yet another aspect of the present disclosure, a photodetection device is provided. The photodetection device comprises: a light absorption structure, formed in a recess at a surface region of a semiconductor substrate; a cathode, lying on a top surface of the light absorption structure, and having a first conductive type; first and second charge multiplication layers, in lateral contact with the light absorption structure from opposite sides of the light absorption structure, and being intrinsic portions of the semiconductor substrate extending into the semiconductor substrate from a topmost surface of the semiconductor substrate; and first and second anodes, being doped regions in the semiconductor substrate having a second conductive type complementary to the first conductive type, wherein the first anode is in lateral contact with the first charge multiplication region from a side of the first charge multiplication region away from the light absorption structure, and the second anode is in lateral contact with the second charge multiplication region from a side of the second charge multiplication region away from the light absorption structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photodetection device, comprising:
   an absorption structure, formed in a recess at a surface region of a semiconductor substrate, and configured to receive an incident light;
   a cathode, formed on a top surface of the absorption structure, and having a first conductive type;
   a charge multiplication layer, in lateral contact with the absorption structure, and being an intrinsic portion of the semiconductor substrate extending into the semiconductor substrate from a topmost surface of the semiconductor substrate;
   an anode, in lateral contact with the charge multiplication layer from a side of the charge multiplication region away from the absorption structure, and being a doped region in the semiconductor substrate having a second conductive type complementary to the first conductive type;
   a charge layer, as a doped region of the semiconductor substrate, and having the first conductive type, wherein the recess accommodating the absorption structure is defined in the charge layer; and
   a capping layer, covering the charge layer and the absorption structure, and formed of a semiconductor material, wherein the cathode is a doped region in the capping layer,
   wherein the absorption structure and the charge layer are directly in lateral contact with a waveguide.

2. The photodetection device according to claim 1, wherein the charge layer extends into the semiconductor substrate from the topmost surface of the semiconductor substrate, and separates an embedded portion of the absorption structure from the charge multiplication region.

3. The photodetection device according to claim 1, wherein the charge layer covers a sidewall and a bottom surface of the embedded portion of the absorption structure.

4. The photodetection device according to claim 1, wherein a total depth of the charge layer is substantially equal to a depth of the charge multiplication region.

5. The photodetection device according to claim 4, wherein the total depth of the charge layer is greater than a depth of the recess.

6. The photodetection device according to claim 1, wherein the capping layer and the cathode conformally covers a protruding portion of the absorption structure protruded from the topmost surface of the semiconductor substrate.

7. The photodetection device according to claim 1, wherein the capping layer is in contact with the charge layer without a portion of the semiconductor substrate in between.

8. The photodetection device according to claim 1, wherein the anode extends into the semiconductor substrate from the topmost surface of the semiconductor substrate.

9. The photodetection device according to claim 1, wherein a trench is formed at a top surface of the anode.

10. The photodetection device according to claim 1, wherein a total depth of the anode is substantially equal to a depth of the charge multiplication region.

11. The photodetection device according to claim 1, wherein the absorption structure protrudes with respect to the waveguide.

12. The photodetection device according to claim 1, wherein the absorption structure is formed of a semiconductor material with a bandgap smaller than a bandgap of a semiconductor material of the semiconductor substrate.

13. A photodetection device, comprising:
- a semiconductor substrate, comprising a back semiconductor layer, a front semiconductor layer and a buried insulating layer sandwiched between the back and front semiconductor layers;
- a charge layer as a doped region of the front semiconductor layer of the semiconductor substrate, formed with a recessed structure, and having a first conductive type;
- an absorption structure, formed in a recess defined by the charge layer, and configured to receive an incident light;
- a capping layer, covering the charge layer and the absorption structure formed, and formed of a semiconductor material;
- a cathode, as a doped region in the capping layer, and having the first conductive type;
- a charge multiplication region, being an intrinsic portion of the front semiconductor layer extending into the front semiconductor layer from the topmost surface of the front semiconductor layer, and in lateral contact with the absorption structure; and
- an anode, being a doped region in the front semiconductor layer extending into the front semiconductor layer from the topmost surface of the front semiconductor layer, and in lateral contact with the charge multiplication region from a side of the charge multiplication region away from the absorption structure, wherein the anode has a second conductive type complementary to the first conductive type,
- wherein the absorption structure and the charge layer are directly in lateral contact with a waveguide.

14. The photodetection device according to claim 13, wherein the charge multiplication region is in lateral contact with the absorption structure through a portion of the charge layer.

15. The photodetection device according to claim 13, wherein the charge multiplication region, the anode and the charge layer extend to a top surface of the buried insulating layer from the topmost surface of the front semiconductor layer.

16. The photodetection device according to claim 13, wherein the absorption structure is vertically spaced apart from the buried insulating layer by a portion of the charge layer.

17. A photodetection device, comprising:
- a light absorption structure, formed in a recess defined in a charge layer as a doped region at a surface region of a semiconductor substrate;
- a capping layer, covering the charge layer and the absorption structure, and formed of a semiconductor material;
- a cathode, as a doped region of the capping layer, and having a first conductive type;
- first and second charge multiplication layers, in lateral contact with the light absorption structure from opposite sides of the light absorption structure, and being intrinsic portions of the semiconductor substrate extending into the semiconductor substrate from a topmost surface of the semiconductor substrate; and
- first and second anodes, being doped regions in the semiconductor substrate having a second conductive type complementary to the first conductive type, wherein the first anode is in lateral contact with the first charge multiplication region from a side of the first charge multiplication region away from the light absorption structure, and the second anode is in lateral contact with the second charge multiplication region from a side of the second charge multiplication region away from the light absorption structure,
- wherein the absorption structure and the charge layer are directly in lateral contact with a waveguide.

18. The photodetection device according to claim 17, wherein the first and second charge multiplication regions are in lateral contact with the light absorption structure via the charge layer.

19. The photodetection device according to claim 17, wherein the absorption structure, the first and second charge multiplication regions, the first and second anodes, and the charge layer are respectively formed in a line shape.

20. The photodetection device according to claim 19, wherein the absorption structure laterally extends to a boundary of the photodetection device.

* * * * *